United States Patent
Liu et al.

(10) Patent No.: US 9,978,758 B1
(45) Date of Patent: May 22, 2018

(54) FLASH MEMORY CELL

(71) Applicant: UNITED MICROELECTRONICS CORP., Hsin-Chu (TW)

(72) Inventors: Weichang Liu, Singapore (SG); Zhen Chen, Singapore (SG); Shen-De Wang, Hsinchu County (TW); Wang Xiang, Singapore (SG); Wei Ta, Singapore (SG); Chuan Sun, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/613,103

(22) Filed: Jun. 2, 2017

(30) Foreign Application Priority Data

May 26, 2017 (CN) .......................... 2017 1 0385065

(51) Int. Cl.
| | |
|---|---|
| *H01L 27/115* | (2017.01) |
| *H01L 29/423* | (2006.01) |
| *H01L 27/11517* | (2017.01) |
| *H01L 21/283* | (2006.01) |
| *H01L 21/02* | (2006.01) |

(52) U.S. Cl.
CPC .... *H01L 27/11517* (2013.01); *H01L 21/0214* (2013.01); *H01L 21/283* (2013.01); *H01L 29/42328* (2013.01)

(58) Field of Classification Search
None
See application file for complete search history.

(56) References Cited

U.S. PATENT DOCUMENTS

| | | | |
|---|---|---|---|
| 2009/0090962 A1 | 4/2009 | Kikuchi | |
| 2016/0133641 A1* | 5/2016 | Hosoda | H01L 29/66833 257/324 |

* cited by examiner

*Primary Examiner* — Asok K Sarkar
(74) *Attorney, Agent, or Firm* — Winston Hsu

(57) ABSTRACT

A flash memory includes a substrate, a memory gate on the substrate, a charge-storage layer between the memory gate and the substrate, a select gate adjacent to the memory gate, a select gate dielectric layer between the select gate and the substrate, a first oxide-nitride spacer between the memory gate and the select gate, and a second oxide-nitride spacer. The select gate includes an upper portion and a lower portion. The second oxide-nitride spacer is disposed between the first oxide-nitride spacer and the upper portion of the select gate.

17 Claims, 7 Drawing Sheets

FLASH MEMORY CELL

CROSS REFERENCE TO RELATED APPLICATION

This application claims the priority from CN application No. 201710385065.6, filed May 26, 2017, which is included in its entirety herein by reference.

BACKGROUND OF THE INVENTION

1. Field of the Invention

The present invention relates to the field of flash memory technology. More particularly, the present invention relates to an improved split gate flash memory and a fabrication method thereof.

2. Description of the Prior Art

It is known that the split gate memory is a nonvolatile flash memory in which the select gate is disposed at a position adjacent to the memory gate. During the programming of the split gate memory, the select gate is applied with a relatively low bias voltage while the memory gate is applied with a high voltage to provide the vertical electric field required for hot carrier injection.

Typically, only a thin oxide-nitride sidewall spacer is provided between the select gate and the memory gate. The thin oxide-nitride sidewall spacer improves the saturation current Idsat or read current of the memory cells. However, on the other hand, the thin oxide-nitride sidewall spacer increases the capacitance between the memory gate and the select gate, which adversely affects the operating speed of the memory cells.

There is still a need for an improved flash memory architecture that can take into account both the saturation current Idsat of memory cells and the improvement in the operating speed of memory cells.

SUMMARY OF THE INVENTION

It is one object of the invention to provide a flash memory that is able to improve both the saturation current Idsat and the operating speed of the memory cells.

According to one aspect of the invention, a flash memory includes a substrate, a memory gate on the substrate, a charge-storage layer between the memory gate and the substrate, a select gate adjacent to the memory gate, a select gate dielectric layer between the select gate and the substrate, a first oxide-nitride spacer between the memory gate and the select gate, and a second oxide-nitride spacer. The select gate includes an upper portion and a lower portion. The second oxide-nitride spacer is disposed between the first oxide-nitride spacer and the upper portion of the select gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
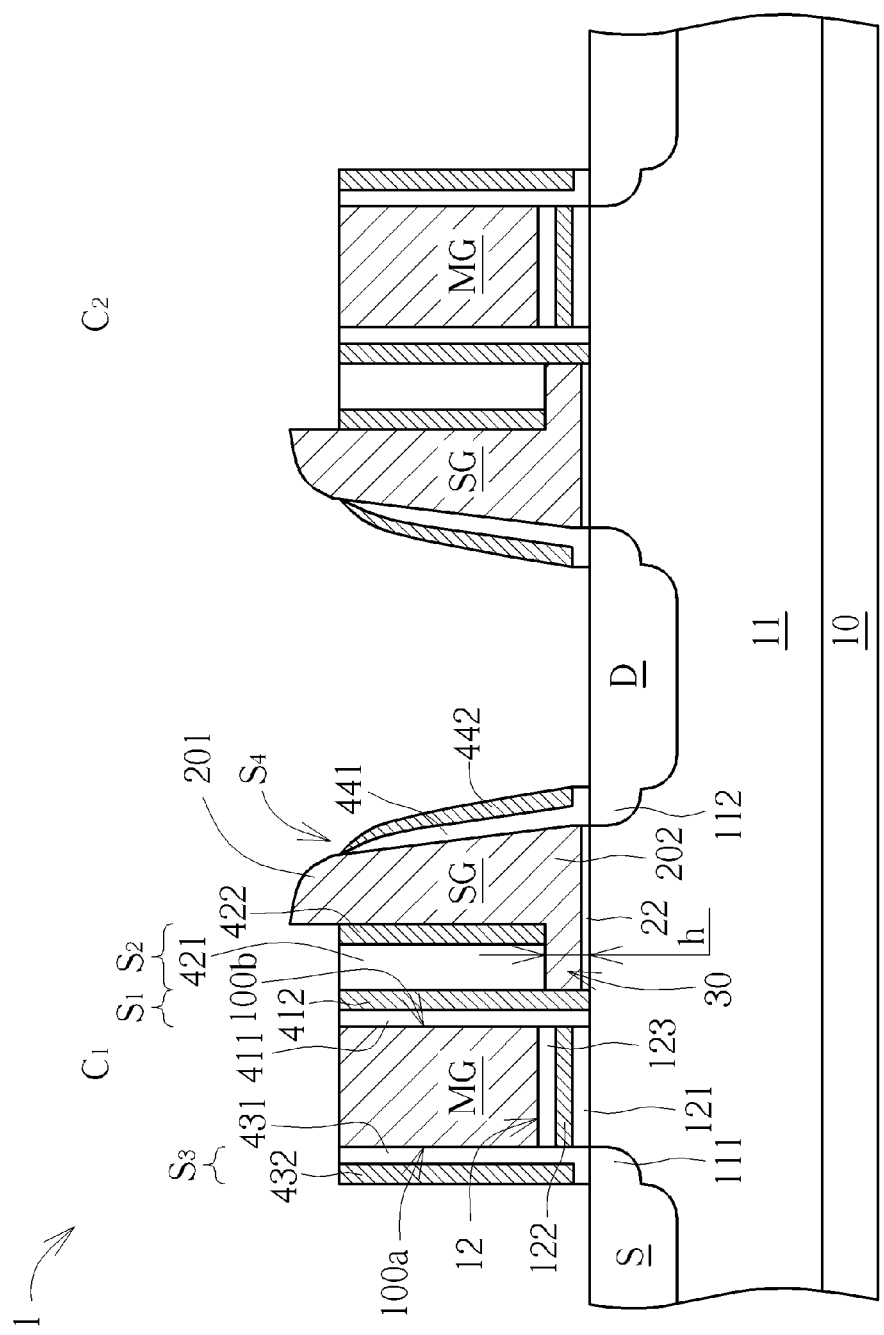
FIG. 1 is a schematic, cross-sectional diagram showing a flash memory according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Please refer to FIG. 1. FIG. 1 is a schematic, cross-sectional diagram showing a flash memory according to one embodiment of the invention. As shown in FIG. 1, the flash memory 1 comprises a substrate 10 such as a silicon substrate or a P type silicon substrate. An array ion well 11 such as a P well may be provided in the substrate 10.

For the sake of simplicity, only two symmetric memory cells $C_1$ and $C_2$ are demonstrated in FIG. 1. The two exemplary memory cells $C_1$ and $C_2$ may be serially coupled together through the commonly shared drain doping region D. However, the present invention is not limited to this configuration. Since the two memory cells $C_1$ and $C_2$ have mirror symmetric structures, the following description will only describe the structure of memory cell $C_1$.

According to one embodiment, the memory cell $C_1$ of the flash memory 1 comprises a memory gate MG, which is disposed on the substrate 10. A charge-storage layer 12 is disposed between the memory gate MG and the substrate 10.

According to one embodiment, the memory gate MG comprises polysilicon. According to one embodiment, the charge-storage layer 12 comprises an oxide-nitride-oxide (ONO) layer.

For example, according to one embodiment, the charge-storage layer 12 comprises a lower silicon oxide layer 121, an intermediate silicon nitride layer 122, and an upper silicon oxide layer 123. The intermediate silicon nitride layer 122 may function as a charge storage medium.

According to one embodiment, the memory cell $C_1$ of the flash memory 1 further comprises select gate SG that is in close proximity to the memory gate MG. According to one embodiment, the memory gate MG may comprise polysilicon, but is not limited thereto.

According to one embodiment, the memory gate MG has a first sidewall surface 100a and a second sidewall surface 100b that is opposite to the first sidewall surface 100a. According to one embodiment, the select gate SG is disposed only on the second sidewall surface 100b.

In other words, no select gate is provided on the first sidewall surface 100a of the memory gate MG. Therefore, the memory cell $C_1$ of the flash memory 1 itself has a left-right asymmetric structure.

According to one embodiment, the select gate SG has an upper portion 201 and a lower portion 202. According one embodiment, the upper portion 201 is continuous with and is structurally integral with the lower portion 202.

According to one embodiment, the memory cell $C_1$ of the flash memory 1 further comprises a select gate dielectric layer 22 that is disposed between the select gate SG and the substrate 10. According to one embodiment, the select gate dielectric layer 22 may be a silicon oxide layer, but is not limited thereto. During program or read operations, the channel underneath the select gate dielectric layer 22 may be turned on to allow the passage electric current.

According to one embodiment, the memory cell $C_1$ of the flash memory 1 further comprises a first oxide-nitride (ON) spacer $S_1$ between the memory gate MG and the select gate SG.

According to one embodiment, the memory cell $C_1$ of the flash memory 1 further comprises a second oxide-nitride (ON) spacer $S_2$ between the first ON spacer $S_1$ and the upper portion 201 of the select gate SG.

According to one embodiment, the second ON spacer $S_2$ is disposed only between the first ON spacer $S_1$ and the upper portion 201 of the select gate SG. That is, the second ON spacer $S_2$ is not disposed between the first ON spacer $S_1$ and the lower portion 202 of the select gate SG.

According to one embodiment, a recessed region 30 that undercuts the second ON spacer $S_2$ is provided directly under the second ON spacer $S_2$ and between the second ON spacer $S_2$ and the substrate 10. According to one embodiment, the lower portion 202 of the select gate SG extends into the recessed region 30. According to one embodiment, the recessed region 30 is completely filled with the lower portion 202 of the select gate SG.

According to one embodiment, the first ON spacer $S_1$ comprises a first silicon oxide layer 411 and a first silicon nitride layer 412. According to one embodiment, the second ON spacer $S_2$ comprises a second silicon oxide layer 421 and a second silicon nitride layer 422.

According to one embodiment, the second silicon oxide layer 421 is in direct contact with the first silicon nitride layer 412. The bottom surface of the first silicon nitride layer 412 is indirect contact with the substrate 10.

According to one embodiment, the first silicon oxide layer 411 has a first thickness and the second silicon oxide layer 421 has a second thickness. For example, the first thickness may be smaller than 10 nanometers and the second thickness may range between 10 and 30 nanometers. The recessed region 30 has a height h. The height h is equal to the second thickness.

According to one embodiment, the lower portion 202 of the select gate SG, which is situated directly under the second ON spacer $S_2$ and extends into the recessed region 30, is only in direct contact with the first silicon nitride layer 412, but is not in direct contact with the first silicon oxide layer 411.

According to one embodiment, the memory gate MG, the first ON spacer $S_1$, and the second ON spacer $S_2$ may have a coplanar top surface. The upper portion 201 of the select gate SG may slightly protrude upward above the coplanar top surface of the memory gate MG, the first ON spacer $S_1$, and the second ON spacer $S_2$.

According to one embodiment, a first lightly doped drain (LDD) spacer $S_3$ may be provided on the first sidewall surface 100a of the memory gate MG. A first lightly doped drain (LDD) region 111 may be provided in the substrate 10 directly under the first LDD spacer $S_3$.

According to one embodiment, the first LDD spacer $S_3$ may comprise a third silicon oxide layer 431 and a third silicon nitride layer 432. The third silicon oxide layer 431 may have an L shaped cross-sectional profile. The third silicon nitride layer 432 may be disposed directly on the third silicon oxide layer 431 and is not in direct contact with the substrate 10.

According to one embodiment, a source doping region S is disposed in the substrate 10 and is adjacent to the first LDD region 111. The source doping region S is contiguous with the first LDD region 111.

According to one embodiment, a second lightly doped drain (LDD) spacer $S_4$ may be provided on the select gate SG. A second lightly doped drain (LDD) region 112 may be provided in the substrate 10 directly under the second LDD spacer $S_4$.

According to one embodiment, a drain doping region D is disposed in the substrate 10 and is adjacent to the second LDD region 112. The drain doping region D is contiguous with the second LDD region 112. According to one embodiment, the memory cell $C_1$ of the flash memory 1 further comprises a channel region in the substrate 10 between the first LDD region 111 and the second LDD region 112.

According to one embodiment, the first LDD region 111 and the second LDD region 112 may be N type LDD regions. According to one embodiment, the source doping region S and the drain doping region D may be $N^+$ doping regions.

According to one embodiment, the second LDD spacer $S_4$ may comprise a fourth silicon oxide layer 441 and a fourth silicon nitride layer 442. The fourth silicon oxide layer 441 may have an L shaped cross-sectional profile. The fourth silicon nitride layer 442 is disposed directly on the fourth silicon oxide layer 441 and is not in direct contact with the substrate 10.

One advantage of the present invention is that the recessed region 30 undercuts the second ON spacer $S_2$ such that the lower portion 202 of the select gate SG can extend into the recessed region 30 directly under the second oxide-nitride sidewall $S_2$. In this way, only the first ON spacer $S_1$ is disposed between the lower portion 202 of the select gate SG and the memory gate MG. Therefore, the saturation current Idsat or the read current of the memory cells is not affected during the read operations.

Further, in addition to the first ON spacer $S_1$, the second ON spacer $S_2$ is interposed between the upper portion 201 of the select gate SG and the memory gate MG so that the lateral distance between the upper portion 201 of the select gate SG and the memory gate MG is increased, which reduces the parasitic capacitance and improves the operating speed.

FIG. 2 to FIG. 7 are schematic, cross-sectional diagrams showing an exemplary method for fabricating the memory cells $C_1$ and $C_2$ of the flash memory 1 in FIG. 1, wherein like numeral numbers designate like elements, layers, or regions.

Figure 2:
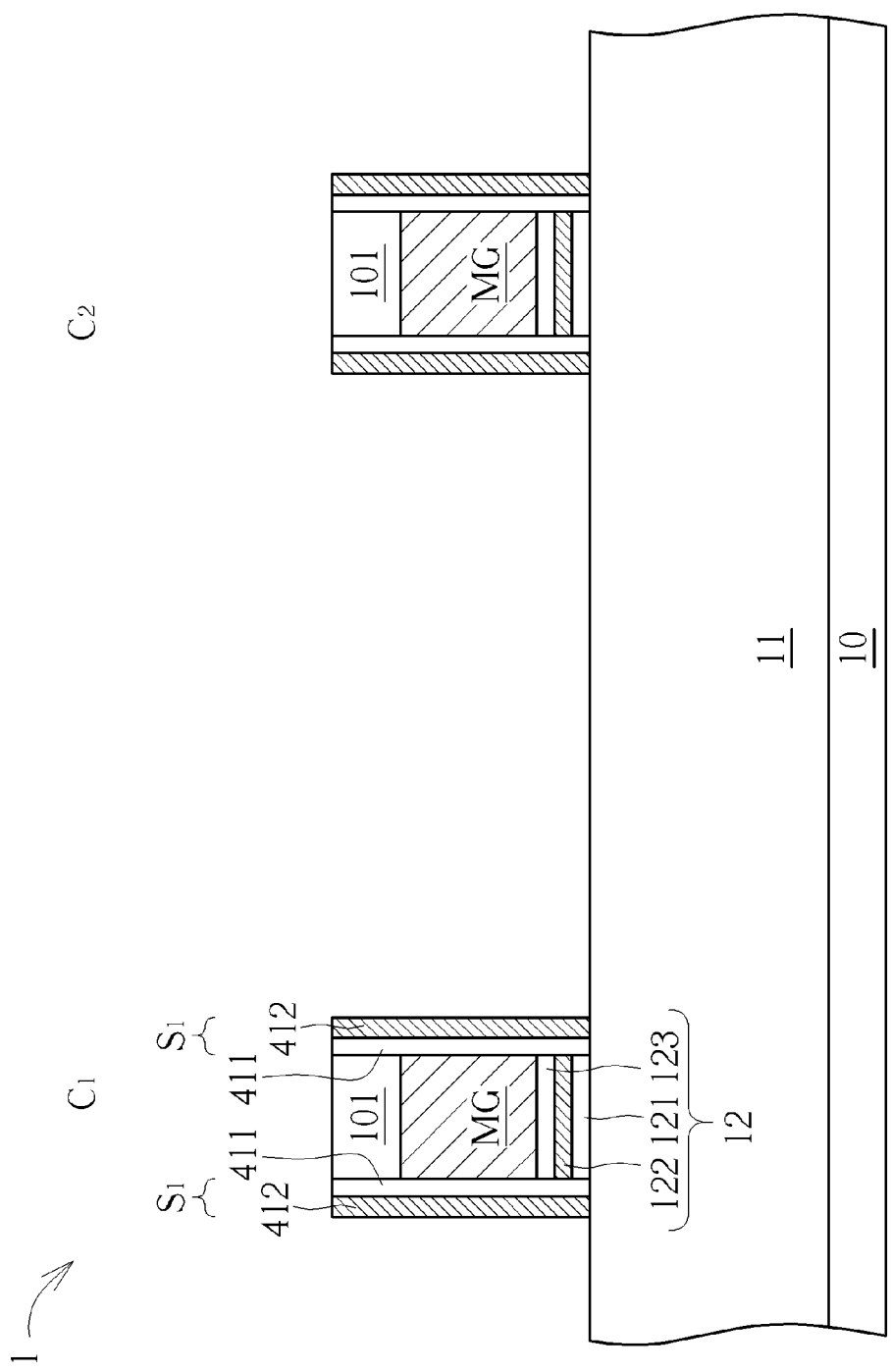
FIG. 2 to FIG. 7 are schematic, cross-sectional diagrams showing an exemplary method for fabricating the flash memory in FIG. 1

As shown in FIG. 2, first, a substrate 10 is provided. For example, the substrate 10 may be a silicon substrate or a P type silicon substrate. An array ion well 11 such as a P well may be provided in the substrate 10. Subsequently, a memory gate MG is formed on the substrate 10. A charge-storage layer 12 is disposed between the memory gate MG and the substrate 10. A dielectric cap layer 101 may be formed on the memory gate MG.

Subsequently, first oxide-nitride (ON) spacers $S_1$ are formed on the first sidewall surface 100a and the second sidewall surface 100b of the memory gate MG, respectively. The first ON spacer $S_1$ comprises a first silicon oxide layer 411 and a first silicon nitride layer 412.

According to one embodiment, the first ON spacer $S_1$ may be formed in two steps. For example, the first silicon oxide layer 411 is first deposited, and then etched back. Thereafter, the first silicon nitride layer 412 is deposited, and then etched back. The lower end of the first silicon nitride layer 412 is indirect contact with the substrate 10.

Figure 3:
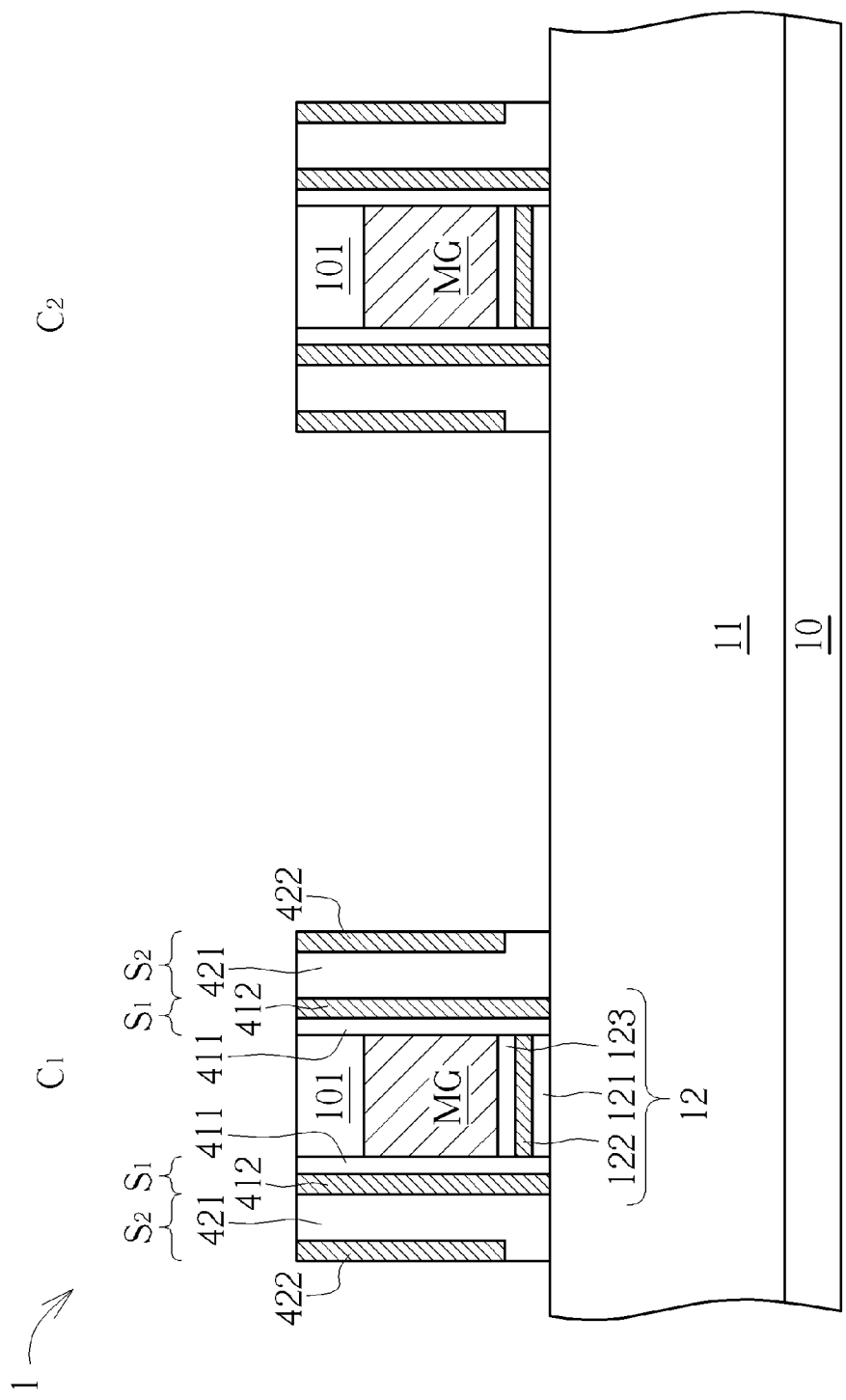

As shown in FIG. 3, second oxide-nitride (ON) spacers $S_2$ are formed on the first oxide-nitride (ON) spacers $S_1$, respectively. The second ON spacers $S_2$ comprises a second silicon oxide layer 421 and a second silicon nitride layer 422. In other embodiments, the second silicon nitride layer 422 may be composed of a material that has an etching selectivity with respect to the first silicon oxide layer 421, for example, SiON, SiCN, SiCON or SiC.

It is noteworthy that the method for forming the second ON spacers $S_2$ is different than that of forming the first ON spacers $S_1$. To form the second ON spacers $S_2$, the second silicon oxide layer 421 and the second silicon nitride layer 422 are first deposited. Thereafter, the second silicon oxide layer 421 and the second silicon nitride layer 422 are etched back. Therefore, the lower end of the second silicon nitride layer 422 is not in direct contact with the substrate 10. The second silicon oxide layer 421 has an L shaped cross-sectional profile.

Figure 4:
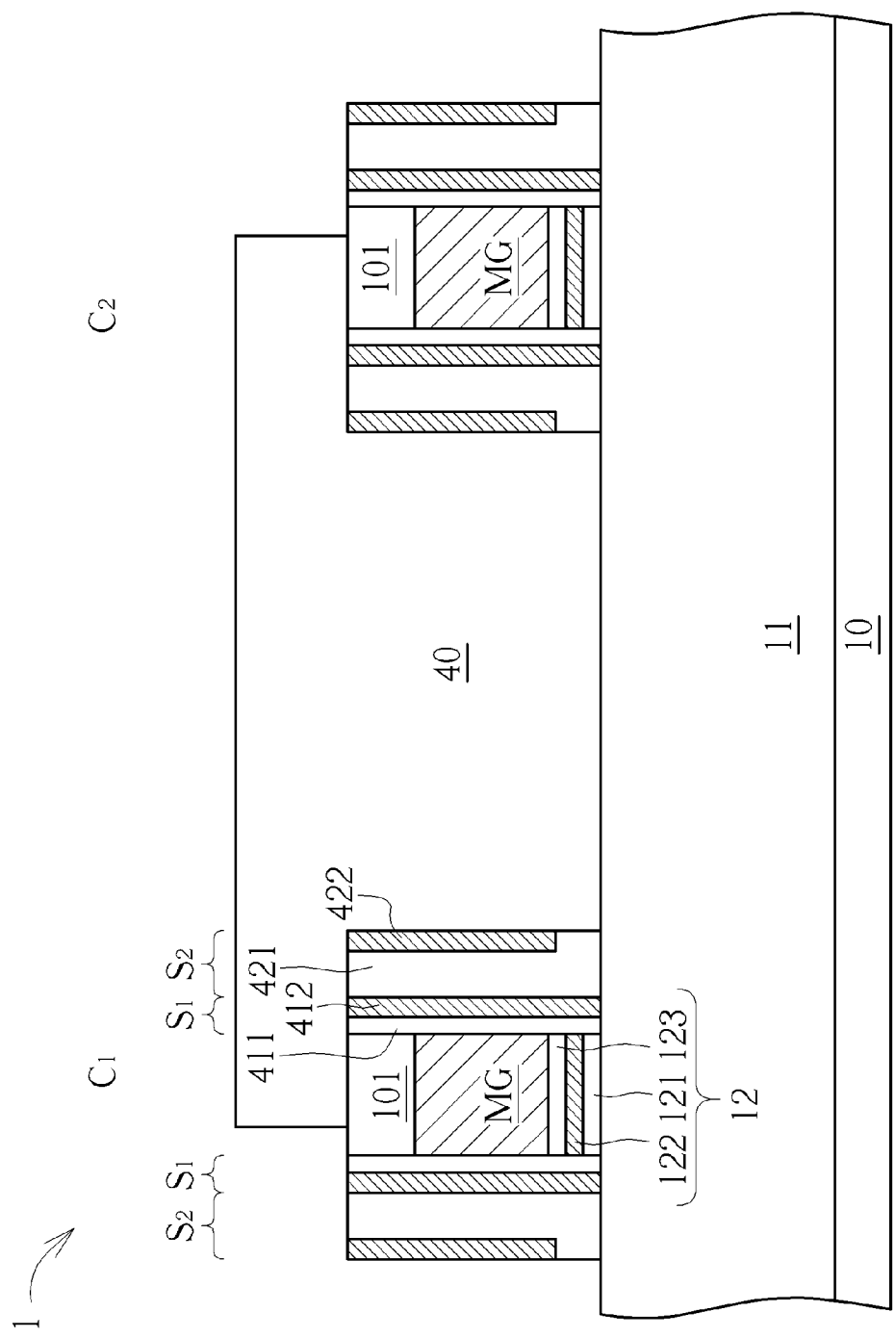

As shown in FIG. 4, a photoresist pattern 40 is formed on the substrate 10. The photoresist pattern 40 covers the first oxide-nitride layer $S_1$ and the second oxide-nitride layer $S_2$ only on the single side of each of the memory cells $C_1$ and $C_2$. The first oxide-nitride layer $S_1$ and the second oxide-nitride layer $S_2$ on the other side of each of the memory cells $C_1$ and $C_2$ not covered by the photoresist pattern 40 are removed by using an etching process. The photoresist pattern 40 is then removed.

In another embodiment, only the second ON spacer $S_2$ on the other side of each of the memory cells $C_1$ and $C_2$ not covered by the photoresist pattern 40 is removed, while the first ON spacers $S_1$ on the other side of each of the memory cells $C_1$ and $C_2$ not covered by the photoresist pattern 40 is kept.

Figure 5:
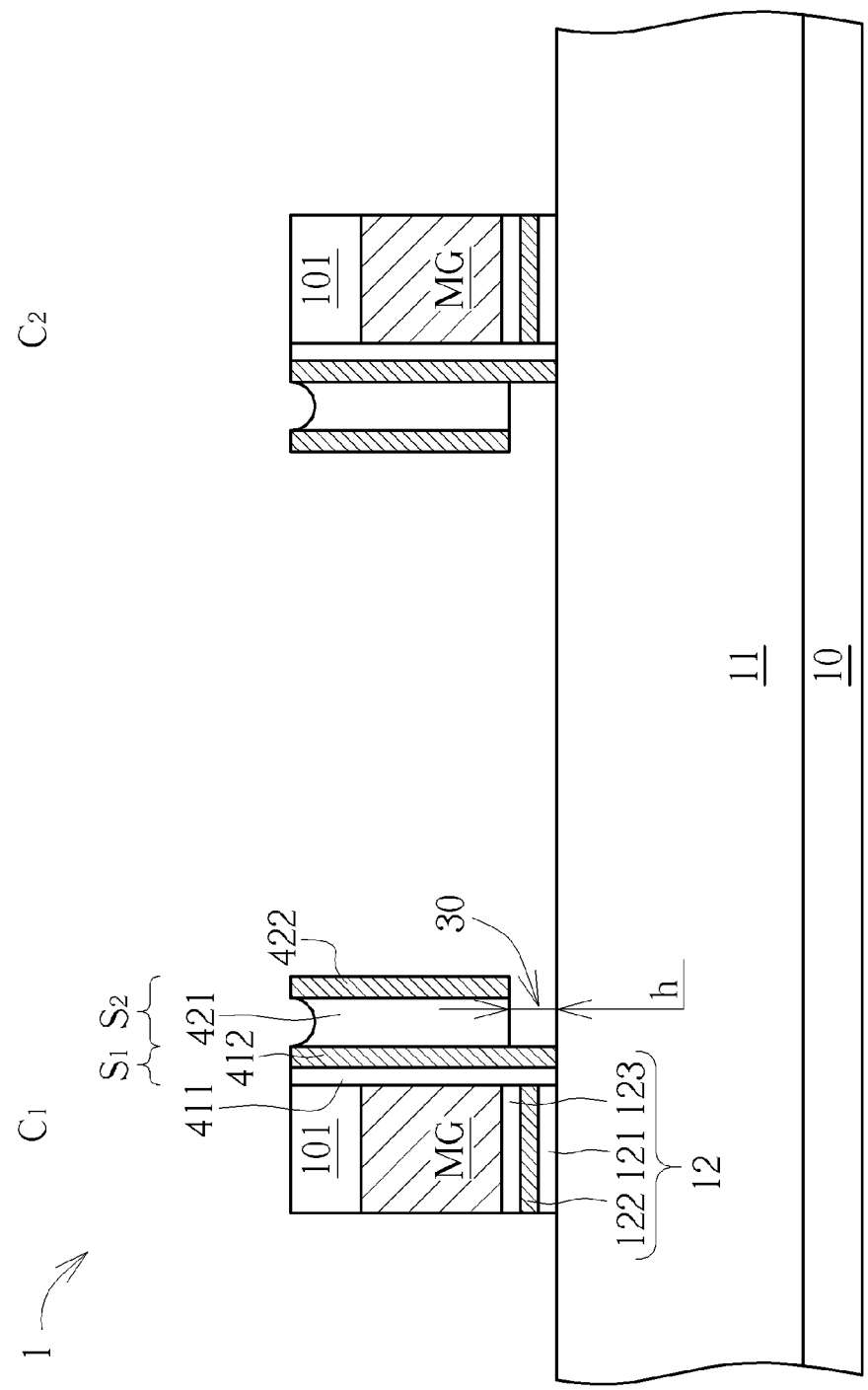

As shown in FIG. 5, a selective etching process is performed to etch only the exposed second silicon oxide layer 421 not covered by the second silicon nitride layer 422 so that a recessed region 30 that undercuts the second ON spacer $S_2$ is formed. The recessed region 30 has a height h. The height h is equal to the thickness of the second silicon oxide layer 421.

In other embodiments, the steps in FIG. 4 and FIG. 5 are mutually exchangeable. That is, the recessed region 30 may be formed first. Subsequently, the first oxide-nitride layer $S_1$ and the second oxide-nitride layer $S_2$ only on the single side of each of the memory cells $C_1$ and $C_2$ is removed.

Figure 6:
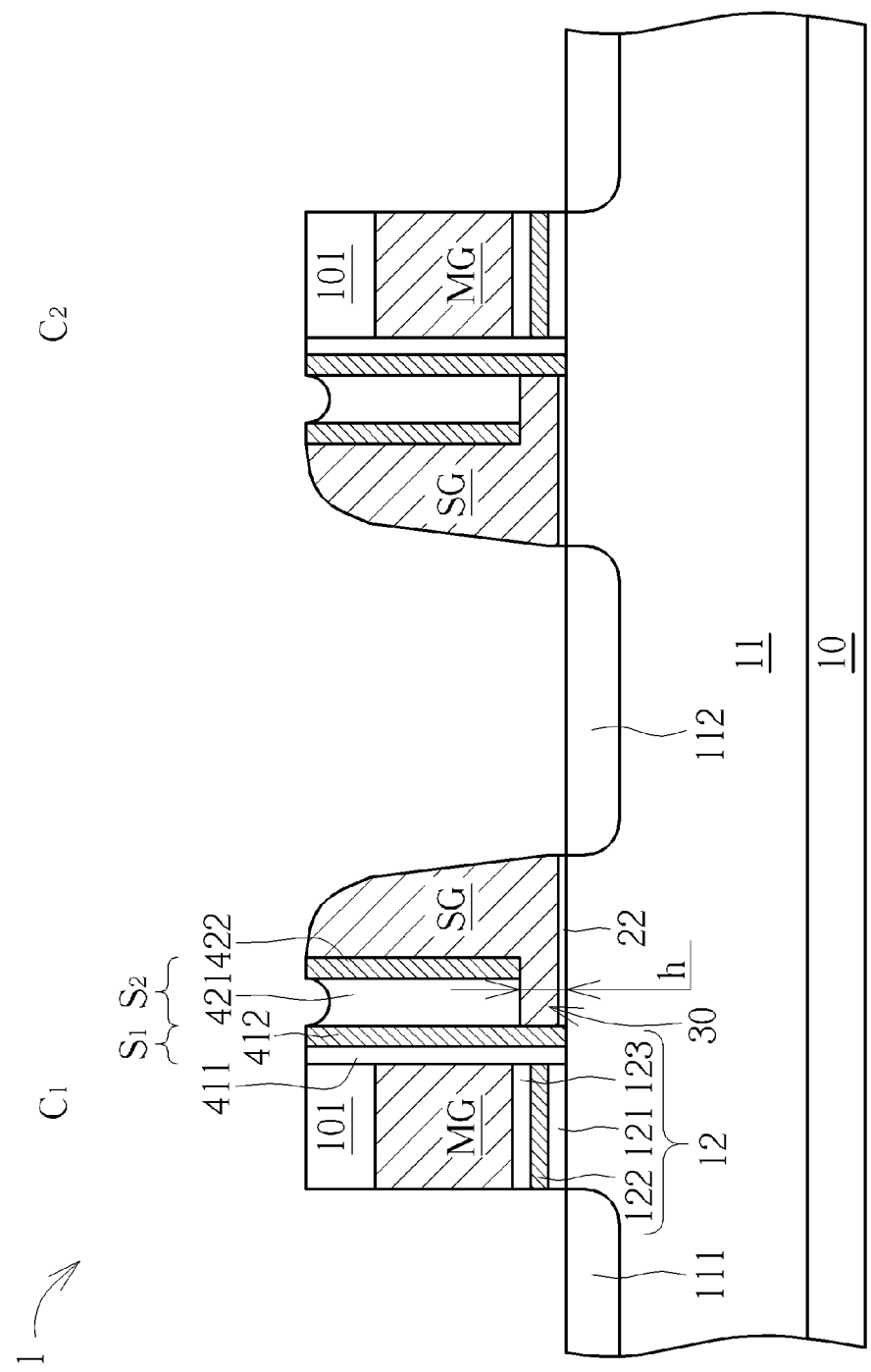

As shown in FIG. 6, a select gate dielectric layer 22 such as a silicon oxide layer is formed on the main surface of the substrate 10. A polysilicon layer (not shown) is conformally deposited on the substrate 10 by using a chemical vapor deposition (CVD) process or an atomic layer deposition (ALD) process. The polysilicon layer is deposited into the recessed region 30. Subsequently, the polysilicon layer is etched back to thereby form the select gate SG.

Subsequently, a lightly doped drain (LDD) ion implantation process is performed to form first LDD region 111 in the substrate 10 on one side of the memory gate MG and a second LDD region 112 in the substrate 10 on one side of the select gate SG.

Figure 7:
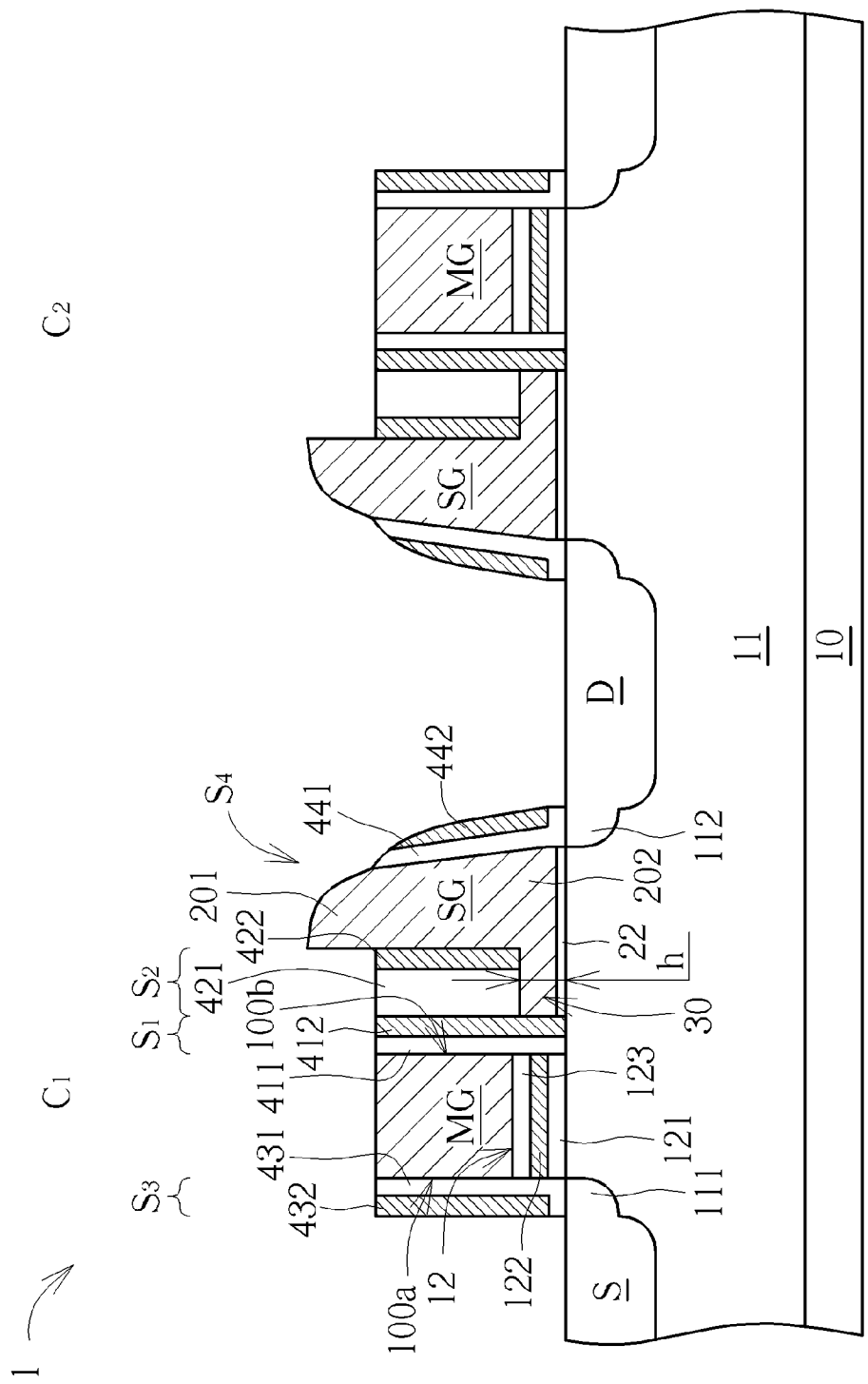

As shown in FIG. 7, a first LDD spacer $S_3$ is formed on one side of the memory gate MG and a second LDD spacer $S_4$ is formed on the select gate SG. A source/drain doping process is then performed to form a source doping region S and a drain doping region D in the substrate 10. The dielectric cap layer 101 and portions of the first ON spacer $S_1$ and the second ON spacer $S_2$ are selectively etched and removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory, comprising:
    a substrate;
    a memory gate on the substrate;
    a charge-storage layer between the memory gate and the substrate;
    a select gate adjacent to the memory gate, wherein the select gate comprises an upper portion and a lower portion;
    a select gate dielectric layer between the select gate and the substrate;
    a first oxide-nitride spacer between the memory gate and the select gate; and
   a second oxide-nitride spacer between the first oxide-nitride spacer and the upper portion of the select gate; and
    a recessed region that undercuts the second oxide-nitride spacer.

2. The flash memory according to claim 1, wherein the memory gate has a first sidewall surface and a second sidewall surface that is opposite to the first sidewall surface.

3. The flash memory according to claim 2, wherein the select gate is disposed only on the second sidewall surface.

4. The flash memory according to claim 3, wherein second oxide-nitride spacer is disposed only between the first oxide-nitride spacer and the upper portion of the select gate above the recessed region.

5. The flash memory according to claim 4, wherein a first lightly-doped drain (LDD) spacer is disposed on the first sidewall surface of the memory gate, wherein a first lightly-doped drain (LDD) region is disposed in the substrate and is directly under the first LDD spacer.

6. The flash memory according to claim 5, wherein a source doping region is disposed in the substrate and is adjacent to the first LDD region.

7. The flash memory according to claim 5, wherein a second lightly-doped drain (LDD) spacer is disposed on the select gate, wherein a second lightly-doped drain (LDD) region is disposed in the substrate and is directly under the second LDD spacer.

8. The flash memory according to claim 7, wherein a drain doping region is disposed in the substrate and is adjacent to the second LDD region.

9. The flash memory according to claim 1, wherein the lower portion of the select gate extends into the recessed region.

10. The flash memory according to claim 9, wherein the first oxide-nitride layer comprises a first silicon oxide layer and a first silicon nitride layer, and the second oxide-nitride layer comprises a second silicon oxide layer and a second silicon nitride layer, wherein the second silicon oxide layer is in direct contact with the first silicon nitride layer.

11. The flash memory according to claim 10, wherein the first silicon oxide layer has first thickness and the second silicon oxide layer has a second thickness, wherein the second thickness is thicker than the first thickness.

12. The flash memory according to claim 11, wherein the recessed region has a height that is equal to the second thickness.

13. The flash memory according to claim 11, wherein the second thickness ranges between 10~30 nm.

14. The flash memory according to claim 1, wherein the charge-storage layer comprises an oxide-nitride-oxide (ONO) layer.

15. The flash memory according to claim 1, wherein the memory gate comprises polysilicon.

16. The flash memory according to claim 1, wherein the select gate comprise polysilicon.

17. The flash memory according to claim 1, wherein the substrate comprises a silicon substrate.

\* \* \* \* \*